United States Patent
Fox et al.

(10) Patent No.: US 10,317,460 B2
(45) Date of Patent: Jun. 11, 2019

(54) PRECISION ALIGNMENT UNIT FOR SEMICONDUCTOR TRAYS

(71) Applicant: Maxim Integrated Products, Inc., San Jose, CA (US)

(72) Inventors: Morris R. Fox, Los Altos, CA (US); Eric G. Anusevicius, Brunswick, GA (US)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 1034 days.

(21) Appl. No.: 14/083,559

(22) Filed: Nov. 19, 2013

(65) Prior Publication Data
US 2014/0361480 A1 Dec. 11, 2014

Related U.S. Application Data

(60) Provisional application No. 61/832,628, filed on Jun. 7, 2013.

(51) Int. Cl.
*G01R 31/28* (2006.01)
*H01L 21/68* (2006.01)

(52) U.S. Cl.
CPC .......... *G01R 31/2867* (2013.01); *H01L 21/68* (2013.01); *Y10T 29/49998* (2015.01)

(58) Field of Classification Search
CPC G01R 31/2867; H01L 21/68; Y10T 29/49998
See application file for complete search history.

(56) References Cited

U.S. PATENT DOCUMENTS 1,456,849 A * 5/1923 Greenwood .......... E04G 13/025
269/125
1,490,608 A * 4/1924 Gilmour ................. B25B 1/103
248/346.03

(Continued)

FOREIGN PATENT DOCUMENTS

CN 101777509 A 7/2010
JP H10144824 A 5/1998

OTHER PUBLICATIONS

Office Action dated Jan. 9, 2018 for Chinese Appln. No. 201410224990.7.

(Continued)

*Primary Examiner* — David P Bryant
*Assistant Examiner* — Nirvana Deonauth
(74) *Attorney, Agent, or Firm* — Kevin E. West; Advent, LLP

(57) ABSTRACT

A precision alignment unit and techniques are described that include a tray assembly configured to be used in a testing system, where the tray assembly includes at least one pocket formed in the tray assembly, the pocket configured to contain an integrated circuit chip, and at least one pin pass-through, and a device positioning unit including at least one alignment device configured to extend through the at least one pin pass-through. In implementations, a process for using the precision alignment system that employs the techniques of the present disclosure includes mounting a precision alignment unit to a vacuum chuck of a handler; loading at least one alignment tray into the handler; placing the at least one alignment tray on the precision alignment unit; and aligning at least one integrated circuit chip device disposed on the at least one alignment tray.

7 Claims, 6 Drawing Sheets

(56) References Cited

U.S. PATENT DOCUMENTS

| | | | | |
|---|---|---|---|---|
| 4,880,349 A | * | 11/1989 | Woodward | B25B 11/005 269/21 |
| 5,307,977 A | * | 5/1994 | Park | B23K 37/04 228/4.5 |
| 5,364,083 A | * | 11/1994 | Ross | B25B 11/005 269/21 |
| 8,230,587 B2 | | 7/2012 | Hofmann et al. | |
| 2002/0158396 A1 | * | 10/2002 | Bennett | H05K 13/021 269/309 |
| 2010/0085070 A1 | | 4/2010 | Tomita et al. | |
| 2011/0295414 A1 | * | 12/2011 | Lambert | H05K 13/022 700/217 |

OTHER PUBLICATIONS

Office Action for Chinese Appln No. 201410224990.7, dated Sep. 28, 2018.

\* cited by examiner

PRECISION ALIGNMENT UNIT FOR SEMICONDUCTOR TRAYS

CROSS-REFERENCE TO RELATED APPLICATIONS

The present application claims the benefit under 35 U.S.C. § 119(e) of U.S. Provisional Application Ser. No. 61/832,628, filed Jun. 7, 2013, and titled "PRECISION ALIGNMENT UNIT FOR SEMICONDUCTOR TRAYS." U.S. Provisional Application Ser. No. 61/832,628 is herein incorporated by reference in its entirety.

BACKGROUND

Testing handlers are a type of automatic test equipment (ATE) employed to test semiconductor packages and/or individual die after fabrication (e.g., subsequent to packaging of the die). Integrated circuit device testing often employs a handler that includes a robotic device and a vacuum chuck configured to hold a tray of devices. In the case of a strip test handler, the handler accepts stacks of strips at an input area, loads the strips for testing, and then stacks the strips in an output area of the handler.

SUMMARY

A precision alignment unit and techniques are described that include a tray assembly configured to be used in a testing system, where the tray assembly includes at least one pocket formed in the tray assembly, the pocket configured to contain and/or at least partially surround an integrated circuit chip, and at least one pin pass-through, and a device positioning unit including at least one alignment device configured to extend through the at least one pin pass-through. In implementations, a precision alignment system includes the tray assembly, the device positioning unit, and a vacuum chuck configured to secure the device positioning unit. In implementations, a process for using the precision alignment system that employs the techniques of the present disclosure includes mounting a precision alignment unit to a vacuum chuck of a handler; loading at least one alignment tray into the handler; placing the at least one alignment tray on the precision alignment unit; and aligning at least one integrated circuit chip device disposed on the at least one alignment tray with a precision alignment unit. Using a handler with a precision alignment unit and alignment tray to test singulated IC packages results in minimal post-test processing requirements, and assemblers can be switched with little impact on test hardware design.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Figure 1A:
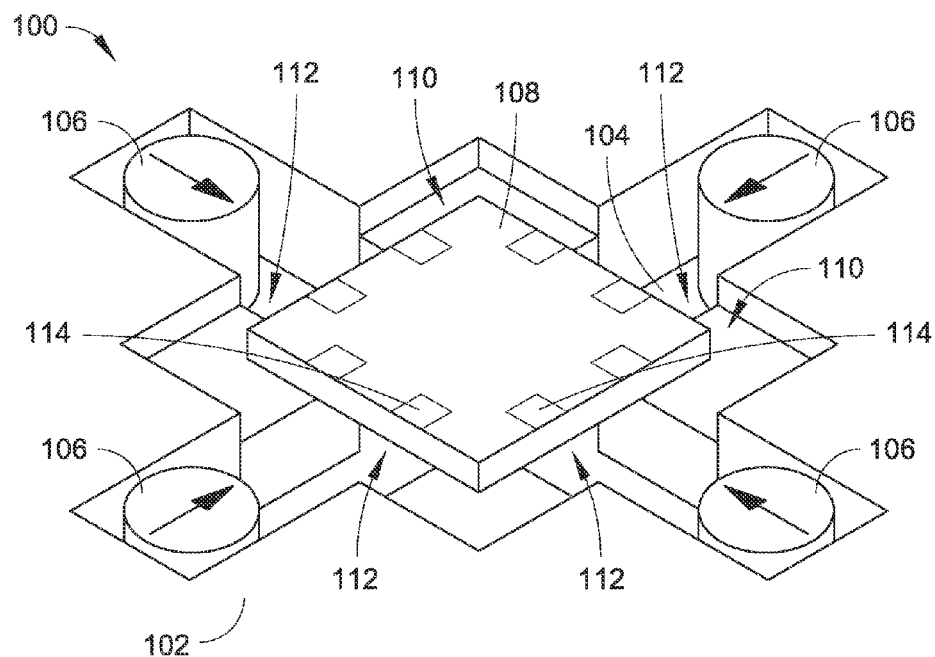
FIG. 1A is a diagrammatic isometric view illustrating a precision alignment unit that includes a carrier tray assembly with at least one pocket and at least one pass-through in accordance with an example implementation of the present disclosure.

Semiconductor devices, integrated circuits (ICs), or other devices are typically tested for reliability before being integrated into a final product. Semiconductor test equipment manufacturers offer different strip test handlers, which are configured to test a strip of integrated circuits that are on a strip. These handlers accept stacks of strips with integrated circuits at the input area and load a strip, one at a time, on the handler's vacuum-secured chuck for testing. The amount of parts tested on the strip can be anywhere from one unit at a time to the entire strip. After testing, the parts are stacked in the handler's output area. Strip testing can be fast, accurate, and nearly jam-free. However, the post-test IC processing required by strip testing can be cumbersome and specialized, and packaging cost leveraging may be limited once a packaging house has been custom designed.

Other types of handlers use a tray for testing singulated integrated circuit chip devices. These trays include a pocket in which each integrated circuit chip device is contained. However, for a robotic arm to transfer each integrated circuit chip in or out of the pocket, extra space is provided in the pocket for the robotic arm to maneuver and grip the integrated circuit chip. This allows for unaligned integrated circuit chip devices in the trays. Alignment of the integrated circuit chip devices is required for contact of the testing equipment with the leads on each integrated circuit chip.

Accordingly, a precision alignment unit and techniques are described that include a tray assembly configured to be used in a testing system, where the tray assembly includes at least one pocket formed in the tray assembly, the pocket configured to contain an integrated circuit chip, and at least one pin pass-through, and a device positioning unit including at least one alignment device configured to extend through the at least one pin pass-through. In embodiments, a precision alignment system includes the tray assembly, the device positioning unit, and a vacuum chuck configured to secure the device positioning unit. In implementations, a process for using the precision alignment system that employs the techniques of the present disclosure includes mounting a precision alignment unit to a vacuum chuck of a handler; loading at least one alignment tray into the handler; placing the at least one alignment tray on the precision alignment unit; and aligning at least one integrated circuit chip device disposed on the at least one alignment tray using a precision alignment unit. Using a handler with a precision alignment unit and alignment tray to test singulated IC packages results in minimal post-test processing requirements, and assemblers can be switched with no impact on test hardware design.

Example Implementations

FIGS. 1A through 1F illustrate a precision alignment unit 100 in accordance with an example implementation of the present disclosure. As shown in FIGS. 1A through 1F, the precision alignment unit 100 includes an carrier tray assembly 102 and a device positioning unit 104. When in use during testing, the carrier tray assembly 102 is placed on the device positioning unit 104 so that each integrated circuit chip device 108 can be aligned for proper contact between the handler testing equipment and each device lead 114.

Figure 1B:
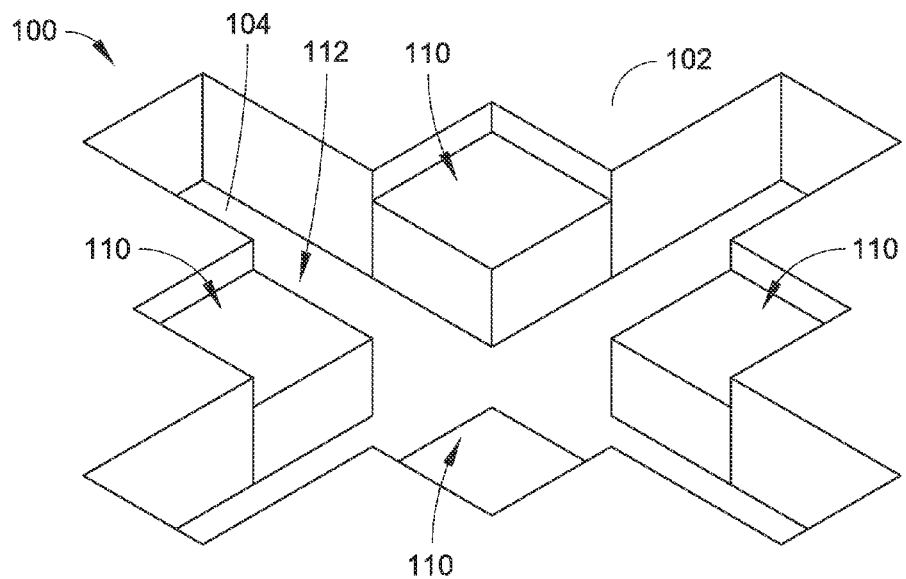
FIG. 1B is a diagrammatic isometric view illustrating a precision alignment unit that includes a carrier tray assembly with at least one pocket and at least one pass-through, and a portion of a device positioning unit with an alignment device in accordance with an example implementation of the present disclosure.
Figure 1C:
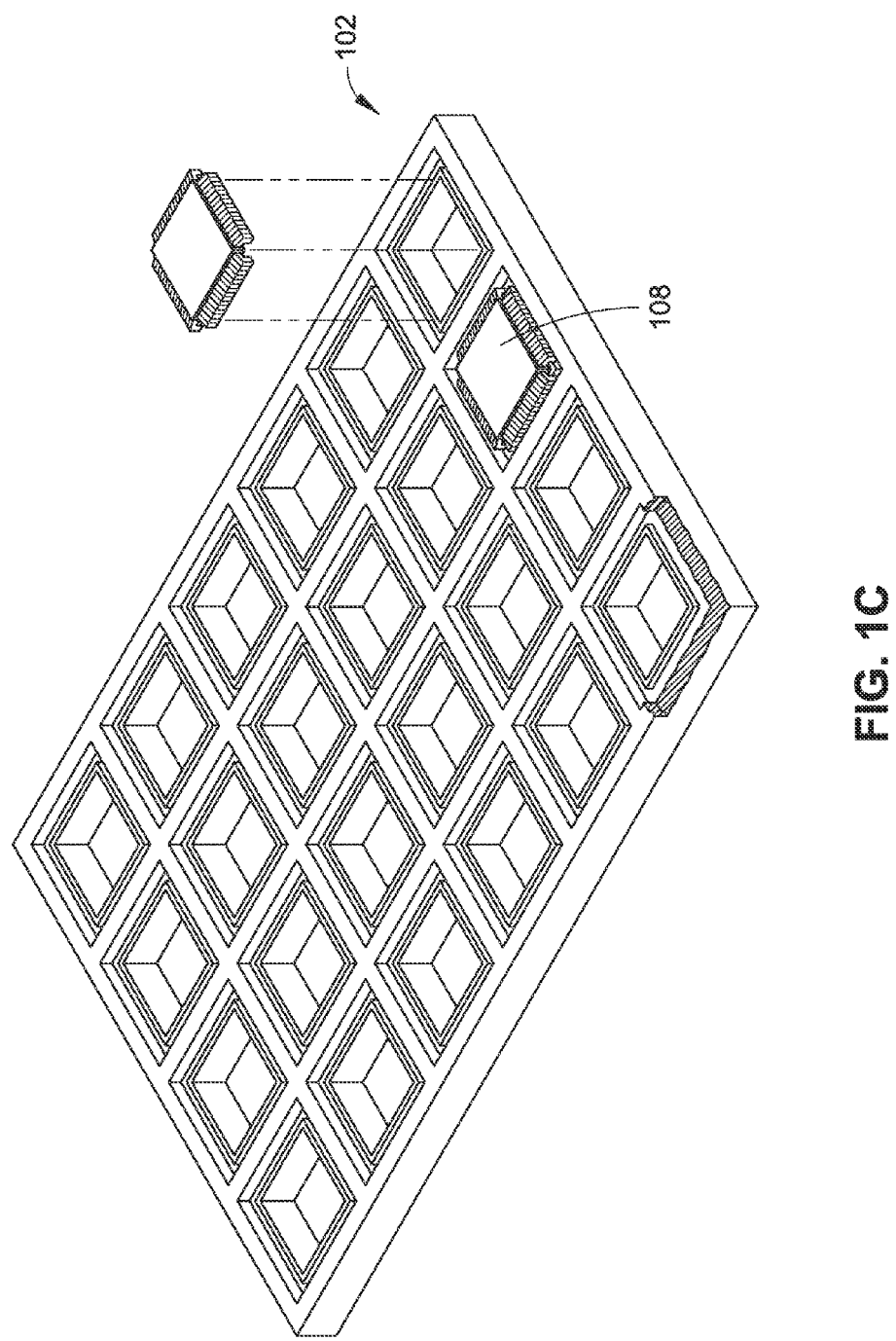
FIG. 1C is a diagrammatic isometric view illustrating a portion of a carrier tray assembly with multiple integrated circuit chip devices in accordance with an example implementation of the present disclosure.

FIGS. 1A and 1B illustrate a precision alignment unit 100 including an carrier tray assembly 102. In implementations, carrier tray assembly 102 can include a standard carrier tray configured for the safe handling, testing, and transport of integrated circuit devices (e.g., an integrated circuit chip device 108), for example a JEDEC tray that conforms with certain specifications (e.g., a typical JEDEC tray measures 322.6 mm×136 mm with thickness of 6.35 mm). In embodiments, JEDEC trays are constructed using molding compounds or other compounds, such as aluminum and/or a polymer. The carrier tray assembly 102 may function to protect each integrated circuit chip device 108 because of the strength and minimum twist and movement of the trays. In implementations, each carrier tray assembly 102 is configured with flat cells in the center area to allow automated handing by vacuum pick up tools. Additionally, the carrier tray assembly 102 may be configured to be stackable for ease of handling. When two or more carrier tray assemblies 102 are stacked, each integrated circuit chip device 108 is prevented from twisting or flipping because of the secure configuration of the stacked top and bottom trays.

As shown in FIGS. 1A through 1D, the carrier tray assembly 102 includes at least one pocket 110 in which integrated circuit chip devices 108 may be nested. In embodiments, the carrier tray assembly 102 includes a JEDEC tray having pockets 110 in fixed position rows and columns. The spacing (e.g., pitch) of each pocket 110 (or cell) in a JEDEC tray can be defined by JEDEC standards. This spacing allows automated pick and place machines (e.g., a handler 600) or other handling machines to dimensionally locate and pick up the integrated circuit chip devices 108 from the carrier tray assembly 102. In implementations, each pocket 110 has a loose pocket tolerance (e.g., there is space on each side of the pocket between the wall of the pocket 110 and the integrated circuit chip device 108) so that the integrated circuit chip devices 108 do not stick when loaded and unloaded.

As shown in FIGS. 1A through 1D, the carrier tray assembly 102 includes at least one pass-through 112 in which an alignment device 106 may be inserted. In implementations, a pass-through 112 includes a slot or other opening extending from and through the backside of the carrier tray assembly 102 (e.g., the side configured to contact or face the device positioning unit 104) to the pocket 110 and front side of the carrier tray assembly 102. In one embodiment and as shown in FIGS. 1A and 1B, the pass-through 112 includes a cross or plus-shaped opening centered in the pocket 110. This configuration allows an alignment device 106 to extend through the pass-through 112 and move toward the integrated circuit chip device 108, as indicated by the movement arrows on each alignment device 106 in FIG. 1A. In other embodiments, the pass-through 112 may include other shapes or forms, for example a rectangle, square, and/or an oval shape.

Figure 1D:
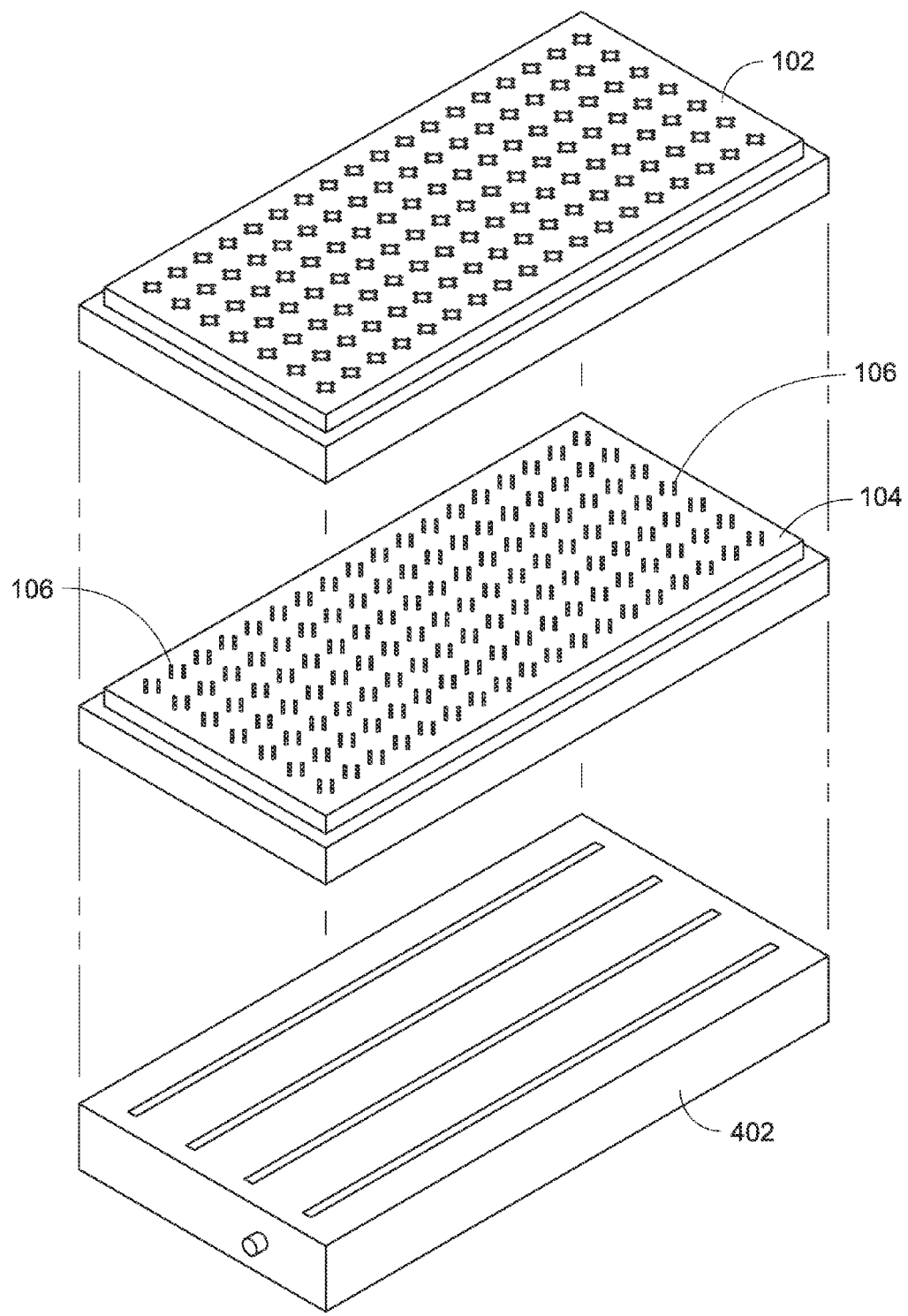
FIG. 1D is a diagrammatic isometric view illustrating a carrier tray assembly, a device positioning unit, and a vacuum chuck in accordance with an example implementation of the present disclosure.
Figure 1E:
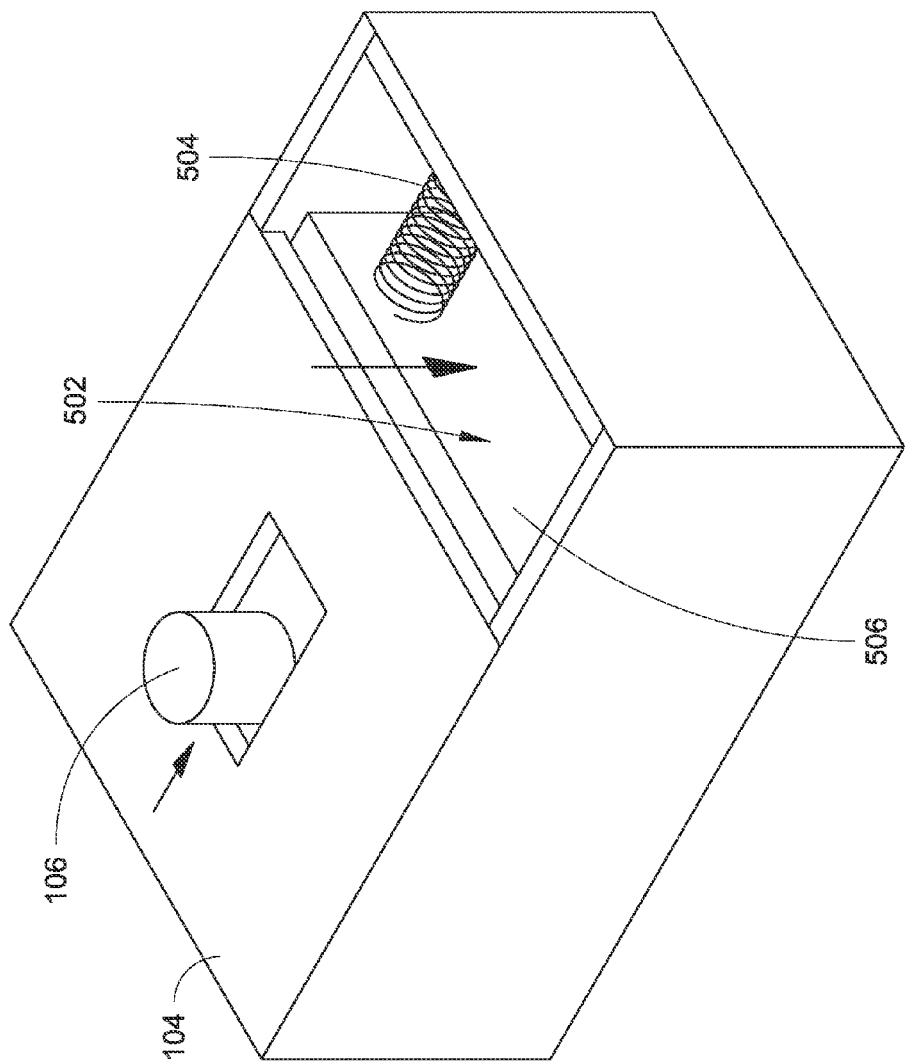
FIG. 1E is a diagrammatic isometric view illustrating a vacuum spring assembly in accordance with an example implementation of the present disclosure.

As shown in FIGS. 1A, 1B, 1D, and 1E, the precision alignment unit 100 includes a device positioning unit 104 configured to be disposed between the carrier tray assembly 102 and a vacuum chuck 402. In implementations, the device positioning unit 104 includes a tray or unit that is generally the same size as (or slightly larger than) the carrier tray assembly 102. Additionally, the device positioning unit 104 includes at least one alignment device 106. In one embodiment and as shown in FIGS. 1A and 1E, an alignment device 106 includes a cylindrical pin configured to extend through a pass-through 112 in a carrier tray assembly 102. In this embodiment, four cylindrical pins functioning as alignment devices 106 extend through the pass-through 112 in a carrier tray assembly 102, one of the four cylindrical pins located on each side of an integrated circuit chip device 108, where the cylindrical pins are configured to move inward and align the integrated circuit chip device 108 in such as way that a device lead 114 on the integrated circuit chip device 108 are properly aligned with testing equipment of a handler 600.

In one specific implementation, the device positioning unit 104 includes a vacuum spring assembly 500 as illustrated in FIG. 1E. In this embodiment, the device positioning unit 104 includes a void 502, a spring 504, and a plate 506. In this specific implementation and illustrated in FIG. 1D, the device positioning unit 104 is placed on a vacuum chuck 402 within a handler 600, and a carrier tray assembly 102 is placed on the device positioning unit 104. As the device positioning unit 104 is placed on the vacuum chuck 402, a vacuum can be applied by the vacuum chuck 402 to hold the device positioning unit 104 in place, where the vacuum actuates movement of the pins. As the vacuum is applied by the vacuum chuck 402 to the device positioning unit 104, the vacuum may be applied to a void 502, which in turn moves a plate 506 that is held in place by a spring 504. At least one alignment device 106 may be coupled to or formed as a portion of the plate 506 and/or device positioning unit 104. As the plate 506 moves and is actuated by the vacuum, the alignment device 106 moves with the plate 506 and simultaneously aligns an integrated circuit chip device 108 disposed in the carrier tray assembly 102 in a predetermined fashion.

In other embodiments, the alignment device(s) 106 may include different shapes and/or configurations. For example, an alignment device 106 may include a wedge configuration. In this example, the wedge may be configured to move in a similar fashion to the above description of the cylindrical pins. In an additional wedge example, a wedge configuration may be configured to be stationary. In this additional wedge example, a portion of a wedge may extend through a pass-through 112 on each side of an integrated circuit chip device 108 disposed in the carrier tray assembly 102 and rely on gravity to pull the integrated circuit chip device 108 down in order to achieve alignment of the integrated circuit chip device 108. In another embodiment, an alignment device 106 may include a block. In this block embodiment, a block configuration may prevent damage and may provide for better alignment of the integrated circuit chip device 108, such as for leaded integrated circuit chip devices 108. In yet other embodiments, alignment device 106 may include sliding rectangles, Vacuum Diaphragm précising, wire guided alignment, elastomeric compression alignment, cam activated alignment, pocket slide alignment, cantilever mechanical alignment and bladder activated alignment.

As illustrated in FIG. 1D, precision alignment unit 100 includes vacuum chuck 402, which is configured to receive a device positioning unit 104 and carrier tray assembly 102 in a handler 600. In implementations, the vacuum chuck 402 may employ a vacuum to hold the device positioning unit 104 and carrier tray assembly 102 in position. As shown, the vacuum chuck 402 is generally rectangular (e.g., larger than or equal in size to the device positioning unit 104). With a vacuum chuck 402, air is pumped from a cavity behind the device positioning unit 104 and atmospheric pressure provides the force holding the device positioning unit 104 down.

Figure 1F:
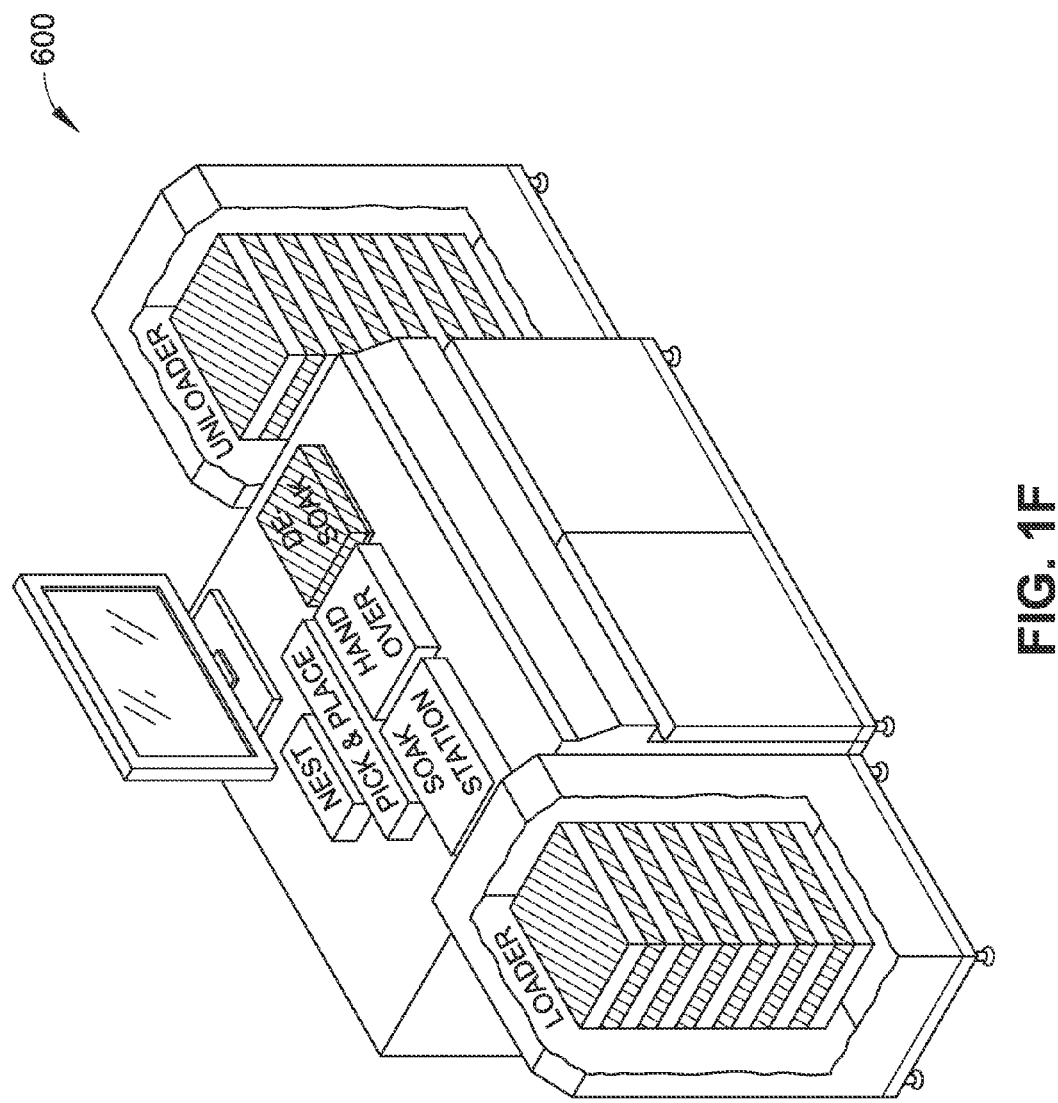
FIG. 1F is a diagrammatic isometric view illustrating a handler in accordance with an example implementation of the present disclosure.

As illustrated in FIG. 1F, handler 600 can be configured to utilize and/or include precision alignment unit 100 including carrier tray assembly 102 and device positioning unit 104. The handler 600 may include equipment configured to position the precision alignment unit 100 so that integrated circuit chip device(s) 108 are tested directly with high precision probes. Utilizing the precision alignment unit 100 can minimize lot changeover times at final test, add temperature testing capabilities, allow nearly unlimited parallel test capabilities on all package types, reduce handler jams, increase units per hour (UPH) test output on non-WLP packages, and/or eliminate the need for multiple test handler models and manufacturers.

Example Processes

Figure 2:
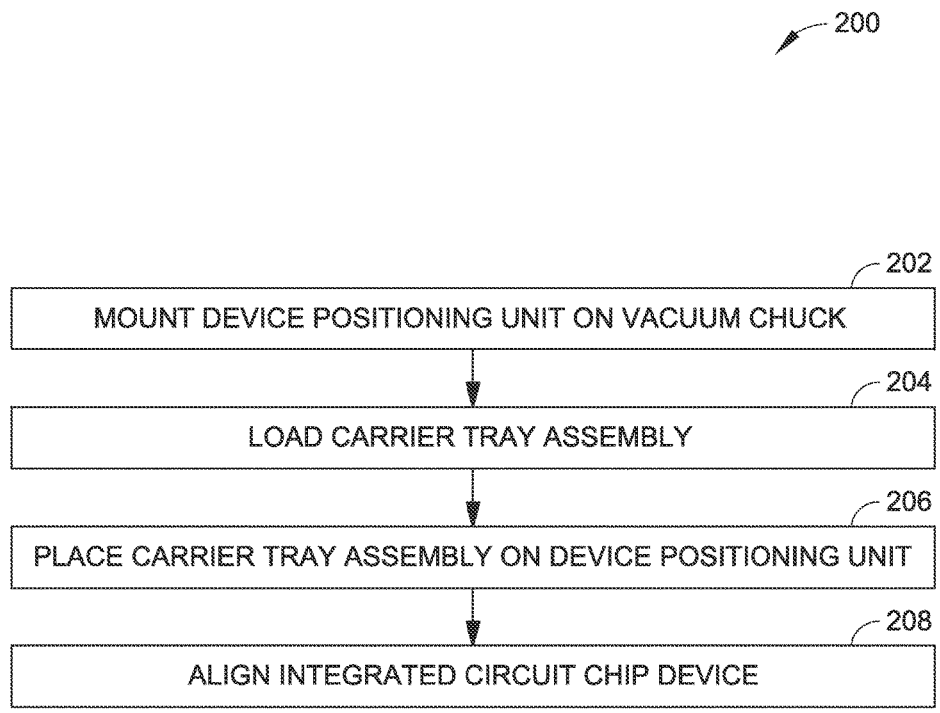
FIG. 2 is a flow diagram illustrating an example process for aligning an integrated circuit chip device utilizing a precision alignment unit illustrated in FIGS. 1A through 1F.

FIG. 2 illustrates an example process 200 that employs precision alignment techniques to test integrated circuit chip devices 108. The process 200 employs an alignment unit, such as the precision alignment unit 100 shown in FIGS. 1A through 1F.

In the process 200 illustrated, a device positioning unit is mounted to a vacuum chuck of a handler (Block 202). In implementations, mounting a device positioning unit 104 includes mounting (e.g., placing, installing, etc.) a device positioning unit 104 on a vacuum chuck 402, where the device positioning unit 104 has been configured and customized to handle a specific size of integrated circuit chip device 108. In some instances, a customized device positioning unit 104 may be referred to as a kit. Additionally, mounting the device positioning unit 104 may include applying a vacuum to the vacuum chuck 402, which may function to hold the device positioning unit 104 in place. Additionally, an applied vacuum may function to actuate at least one alignment device 106 in some embodiments, as discussed above.

At least one carrier tray assembly is loaded into a handler (Block 204). In implementations and once the device positioning unit 104 is installed, a stack of integrated circuit chip devices 108 in carrier tray assemblies 102 may be loaded into an input area of the handler 600. In these implementations, a carrier tray assembly 102 with integrated circuit chip devices 108 can be transported toward the vacuum chuck 402 and device positioning unit 104.

Then, the carrier tray assembly is placed on the device positioning unit (Block 206). In implementations, the handler 600 places a carrier tray assembly 102 that has been transported from the input area of the handler 600 onto the device positioning unit 104. In some embodiments, placing the carrier tray assembly 102 onto the device positioning unit 104 may include applying a vacuum (if not previously applied), which may function to actuate an alignment device 106 included on the device positioning unit 104.

At least one integrated circuit chip device is aligned (Block 208). In implementations, the alignment device 106 aligns at least one integrated circuit chip device 108 disposed in the pocket(s) 110 of the carrier tray assembly 102. In some embodiments, aligning the integrated circuit chip device(s) 108 includes actuating the alignment device 106 with vacuum generated from the vacuum chuck 402, as described above, where the alignment device 106 contacts the integrated circuit chip device 108 and physically moves the integrated circuit chip device 108 into an aligned position. In other embodiments, aligning the integrated circuit chip device(s) 108 includes using gravity or other methods using the alignment devices 106 described above (e.g., using blocks, sliding rectangles, Vacuum Diaphragm précising, wire guided alignment, elastomeric compression alignment, cam activated alignment, pocket slide alignment, cantilever mechanical alignment and bladder activated alignment).

Following alignment of the integrated circuit chip devices 108, the integrated circuit chip devices 108 may be tested by the handler 600 or other testing equipment and removed from the handler 600 by similar methods described above.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:
1. A precision alignment unit, comprising:
a carrier tray assembly configured to be used in a testing system, the carrier tray assembly including
at least one pocket formed in the carrier tray assembly and configured to hold an integrated circuit chip device, and
at least one pin pass-through that extends from a first side of the carrier tray assembly to a second side of the carrier tray assembly opposite the first side, the first side configured to face a device positioning unit, the second side configured to include the at least one pocket;
the device positioning unit including at least one alignment device configured to extend through the at least one pin pass-through in the carrier tray assembly, the at least one alignment device including at least one pin that is disposed on at least one side of the integrated circuit chip device and configured to move inward and align the integrated circuit chip device; and
a vacuum chuck configured to secure the device positioning unit, where the carrier tray assembly is disposed on the device positioning unit.
2. The precision alignment unit as recited in claim 1, wherein the carrier tray assembly includes a JEDEC standard matrix tray.
3. The precision alignment unit as recited in claim 1, wherein the at least one pin comprises a cylindrical pin.

4. A precision alignment system, comprising:
a carrier tray assembly configured to be used in a testing system, the carrier tray assembly including
at least one pocket formed in the tray assembly and configured to hold an integrated circuit chip device, and
at least one pin pass-through that extends from a first side of the carrier tray assembly to a second side of the carrier tray assembly opposite the first side, the first side configured to face a device positioning unit, the second side configured to include the at least one pocket;
the device positioning unit including at least one alignment device configured to extend through the at least one pin pass-through in the carrier tray assembly, the at least one alignment device including at least one pin that is disposed on at least one side of the integrated circuit chip device and configured to move inward and align the integrated circuit chip device; and
a vacuum chuck configured to secure the device positioning unit, where the tray assembly is disposed on the device positioning unit.

5. The precision alignment system as recited in claim 4, wherein the carrier tray assembly includes a JEDEC standard matrix tray.

6. The precision alignment system as recited in claim 4, wherein the at least one pin comprises a cylindrical pin.

7. The precision alignment system as recited in claim 4, wherein the vacuum chuck configured to secure the device positioning unit creates a vacuum that initiates alignment device movement using a vacuum spring assembly.

* * * * *